United States Patent
Komatsu et al.

(10) Patent No.: US 12,230,539 B2
(45) Date of Patent: Feb. 18, 2025

(54) WAFER CHIP SCALE PACKAGING WITH BALL ATTACH BEFORE REPASSIVATION

(71) Applicant: Texas Instruments Incorporated, Dallas, TX (US)

(72) Inventors: Daiki Komatsu, Beppu (JP); Makoto Shibuya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1447 days.

(21) Appl. No.: 16/051,590

(22) Filed: Aug. 1, 2018

(65) Prior Publication Data
US 2020/0043778 A1 Feb. 6, 2020

(51) Int. Cl.
| | | |
|---|---|---|
| H01L 23/52 | (2006.01) | |
| H01L 21/768 | (2006.01) | |
| H01L 23/00 | (2006.01) | |
| H01L 23/49 | (2006.01) | |
| H01L 23/522 | (2006.01) | |
| H01L 23/532 | (2006.01) | |
| H01L 23/538 | (2006.01) | |

(52) U.S. Cl.
CPC .. *H01L 21/76837* (2013.01); *H01L 21/76877* (2013.01); *H01L 21/76885* (2013.01); *H01L 23/5226* (2013.01); *H01L 23/5329* (2013.01); *H01L 23/5386* (2013.01); *H01L 24/11* (2013.01); *H01L 24/14* (2013.01); *H01L 2924/35* (2013.01)

(58) Field of Classification Search
CPC .......... H01L 21/76807–76813; H01L 21/76877–76885; H01L 2224/12105; H01L 2224/13022
See application file for complete search history.

(56) References Cited

U.S. PATENT DOCUMENTS

| | | | |
|---|---|---|---|
| 7,666,709 B1* | 2/2010 | Lin | ...................... H01L 21/6835 438/106 |
| 8,450,151 B1 | 5/2013 | Poddar et al. | |
| 9,663,357 B2 | 5/2017 | Mao et al. | |
| 2006/0038291 A1* | 2/2006 | Chung | ................ H01L 23/3114 257/738 |
| 2007/0184578 A1* | 8/2007 | Lin | ...................... H05K 3/3452 438/106 |

(Continued)

OTHER PUBLICATIONS

First Chinese Office Action mailed Nov. 13, 2024, Chinese Application No. 201907054109, 14 pages.

*Primary Examiner* — Didarul A Mazumder
(74) *Attorney, Agent, or Firm* — Ronald O. Neerings; Frank D. Cimino

(57) ABSTRACT

Disclosed examples provide methods that include forming a conductive structure at least partially above a conductive feature of a wafer, attaching a solder ball structure to a side of the conductive structure, and thereafter forming a repassivation layer on a side of the wafer proximate the side of the conductive structure. Further examples provide microelectronic devices and integrated circuits that include a conductive structure coupled with a conductive feature of a metallization structure, a solder ball structure connected to the conductive structure, and a printed repassivation layer disposed on the side of the metallization structure proximate a side of the conductive structure.

4 Claims, 17 Drawing Sheets

(56) References Cited

U.S. PATENT DOCUMENTS

| | | | |
|---|---|---|---|
| 2011/0026232 A1* | 2/2011 | Lin | H01L 23/481 |
| | | | 361/760 |
| 2011/0318919 A1* | 12/2011 | Horigome | H01L 21/32051 |
| | | | 438/653 |
| 2013/0009307 A1* | 1/2013 | Lu | H01L 24/13 |
| | | | 257/738 |
| 2013/0127044 A1 | 5/2013 | Poddar et al. | |
| 2014/0124928 A1* | 5/2014 | Lin | H01L 24/13 |
| | | | 257/738 |
| 2014/0252601 A1* | 9/2014 | Lu | H01L 24/13 |
| | | | 257/737 |
| 2014/0367711 A1* | 12/2014 | Bibl | H01L 24/24 |
| | | | 257/89 |
| 2015/0130072 A1* | 5/2015 | Wu | H01L 25/0657 |
| | | | 257/774 |
| 2016/0144570 A1* | 5/2016 | Kim | B29C 35/0805 |
| | | | 425/174.4 |
| 2017/0125325 A1 | 5/2017 | Shibuya | |
| 2017/0213865 A1* | 7/2017 | Yiu | H01L 27/1462 |
| 2018/0122731 A1 | 5/2018 | Komatsu et al. | |

* cited by examiner

WAFER CHIP SCALE PACKAGING WITH BALL ATTACH BEFORE REPASSIVATION

BACKGROUND

Integrated circuits and packaged electronic components (e.g., microelectronic devices) are often produced from a semiconductor-based die or chip with one or more electronic components. A variety of integrated packaging types are available, including flip-chip ball grid array (FC-BGA) direct surface mountable packages. FC-BGA include a die mounted to a substrate, such as a printed circuit board (PCB), which in turn has conductive pads or balls for soldering to a user board. Wafer chip scale packaging or wafer level chip scale packaging (WCSP or WLCSP) technology is employed in manufacturing flip-chip BGA devices. In one WCSP process, lithographic steps are performed on a wafer or die to spin coat, expose, develop, and etch a repassivation layer with patterned openings at locations for formation of copper pillar contact structures and subsequent solder ball drop or placement prior to surface mount soldering of the die to a carrier substrate. The repassivation material protects the copper and passivates the copper surface, and mechanically strengthens the base of the copper pillar during assembly to the carrier substrate. The use of spin coating and patterning to form the repassivation layer is costly in terms of low materials usage and extra process masks. Printing processing can be used to deposit the repassivation layer, but the printed shape is less precise than a pattern spin-coded process due to minimum printed droplet size and lower resolution position control. Also, ink bleed out leads to edge roughness and the presence of repassivation material in areas destined for solder ball placement, causing missing solder balls due to solder ball cracking and delamination from stress concentration. Also, non-fusion of solder balls leads to missing solder balls, causing non-fusion of solder, due to ink bleeding out. In addition, edge roughness of repassivation materials causes non-circular openings where a solder ball is to be placed, and can induce missing solder balls due to stress concentration after ball attach and reflow.

SUMMARY

Described examples provide wafer level chip scale packaging processes and devices using solder ball placement followed by repassivation layer formation to mitigate or avoid repassivation material edge roughness and bleed out effects at solder ball locations. In certain examples, a repassivation layer is printed using additive manufacturing techniques after solder ball placement to further provide materials usage benefits compared to conventional repassivation layer spin-coating processes. Disclosed method examples include forming a conductive structure at least partially above a conductive feature of a wafer, attaching a solder ball structure to a side of the conductive structure, and thereafter forming a repassivation layer on a side of the wafer proximate the side of the conductive structure. Further examples provide microelectronic devices and integrated circuits that include a conductive structure coupled with a conductive feature of a metallization structure, a solder ball structure connected to the conductive structure, and a printed repassivation layer disposed on the side of the metallization structure proximate a side of the conductive structure.

DETAILED DESCRIPTION

Figure 1:
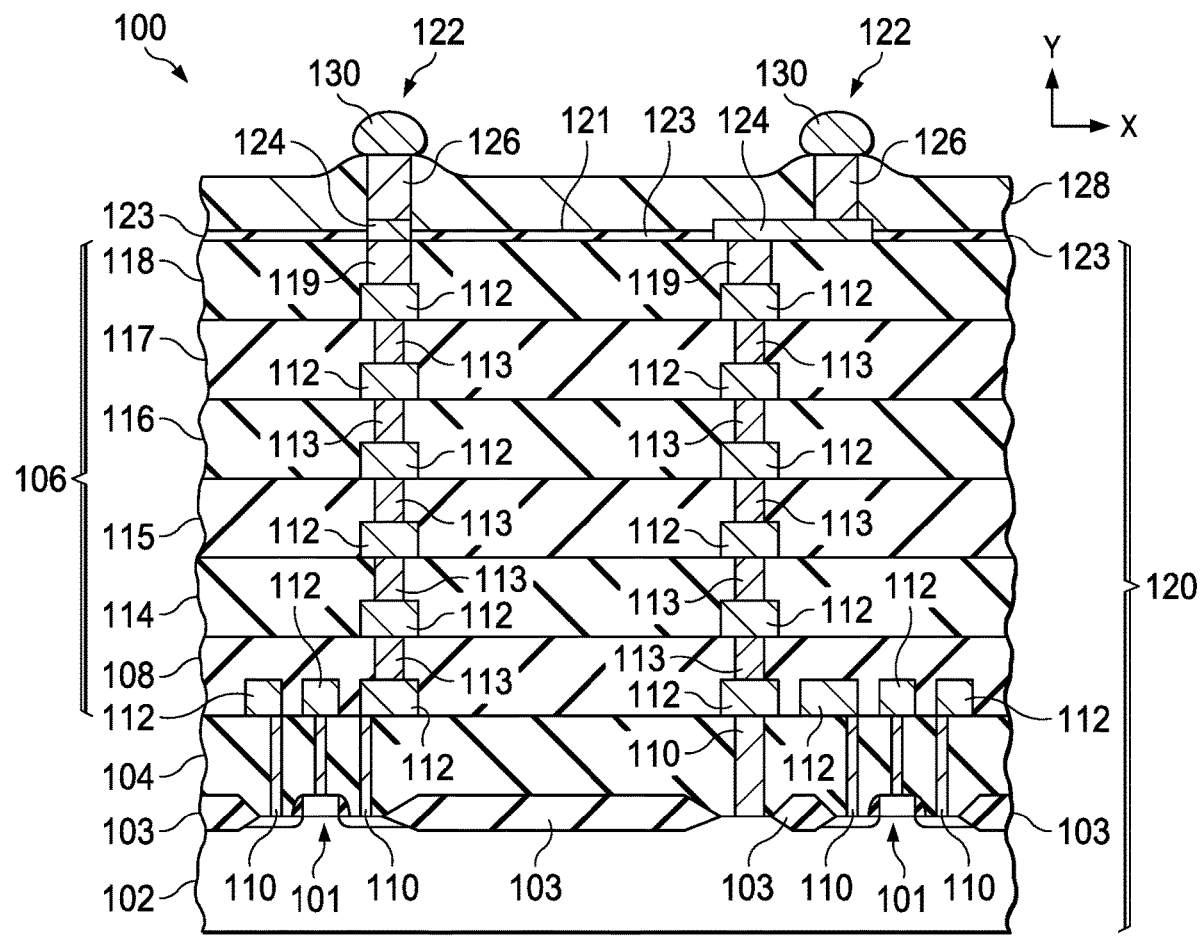
FIG. 1 is a partial sectional side elevation view of a microelectronic device with contact structures and a printed repassivation layer.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a microelectronic device 100 that includes multiple electronic components 101 (e.g., metal oxide semiconductor (MOS) transistors) disposed on or in a semiconductor substrate 102. Although the example device 100 is an integrated circuit with multiple components 101, other microelectronic device implementations can include a single electronic component. The semiconductor substrate 102 in one example is a silicon wafer, a silicon-on-insulator (SOI) substrate or other semiconductor structure. Isolation structures 103 are disposed on select portions of an upper surface or side of the substrate 102. The isolation structures 103 can be shallow trench isolation (STI) features or field oxide (FOX) structures in some examples. The device 100 also includes a multi-layer metallization structure 104, 106 disposed above the substrate 102. The metallization structure includes a first dielectric structure layer 104 formed over the substrate 102, as well as a multi-level upper metallization structure 106. In one example, the first dielectric 104 structure layer is a pre-metal dielectric (PMD) layer disposed over the components 101 and the upper surface of the substrate 102. In one example, the first dielectric structure layer 104 includes silicon dioxide ($SiO_2$) deposited over the components 101, the substrate 102 and the isolation structures 103.

The example device 100 of FIG. 1 includes a 6 layer upper metallization structure 106 with a first layer 108, referred to herein as an interlayer or interlevel dielectric (ILD) layer. Different numbers of layers can be used in different implementations. In one example, the first ILD layer 108, and the other ILD layers of the upper metallization structure 106 are formed of silicon dioxide ($SiO_2$) or other suitable dielectric material. In certain implementations, the individual layers of the multi-layer upper metallization structure 106 are formed in two stages, including an intra-metal dielectric (IMD, not shown) sub layer and an ILD sublayer overlying the IMD sub layer. The individual IMD and ILD sublayers can be formed of any suitable dielectric material or materials, such as $SiO_2$-based dielectric materials. Tungsten or other conductive contacts 110 extend through selective portions of the first dielectric structure layer 104. The first ILD layer 108, and the subsequent ILD layers in the upper metallization structure 106 include conductive metallization interconnect structures 112, such as aluminum formed on the top surface of the underlying layer. In this example, the first layer 108 and the subsequent ILD layers also include conductive vias 113, such as tungsten, providing electrical connection from the metallization features 112 of an individual layer to an overlying metallization layer. The example of FIG. 1 includes a second layer 114 disposed over the first layer 108. The ILD layer 108 includes conductive interconnect structures 112 and vias 113. The illustrated structure includes further metallization levels with corresponding dielectric layers 115, 116 and 117, as well as an uppermost or top metallization layer 118. The individual layers 115-118 in this example include conductive interconnect structures 112 and associated vias 113. The substrate 102, the electronic components 101, the first dielectric structure layer 104 and the upper metallization structure 106 form a wafer or die 120 with an upper side or surface 121. The upper side 121 of the metallization structure 106 in one example forms an upper side of the wafer or die 120.

The top metallization layer 118 includes two example conductive features 119, such as upper most aluminum vias. The conductive features 119 include a side or surface at the upper side 121 of the wafer or die 120 at the top of the uppermost metallization layer 118. Any number of conductive features 119 may be provided. One or more of the conductive features 119 can be electrically coupled with an electronic component 101. The upper ILD dielectric layer 118 in one example is covered by one or more passivation layers 123 (e.g., protective overcoat (PO) and/or passivation layers), for example, silicon nitride (SiN), silicon oxynitride (SiO$_x$N$_y$), or silicon dioxide (SiO$_2$). In one example, the passivation layer or layers 123 include one or more openings that expose a portion of the conductive features 119 to allow electrical connection of the features 119 to corresponding contact structures.

In the example of FIG. 1, the microelectronic device 100 includes two contact structures 122. The contact structures 122 extend outward (e.g., upward along the "Y" direction in FIG. 1) from the upper side 121 of the metallization structure 106. The individual contact structures 122 are electrically coupled with a corresponding one of the conductive features 119. The individual contact structures 122 include a conductive seed layer 124 and a conductive structure 126 (e.g., a copper post or pillar). In certain examples, the seed layer 124 can be omitted. The conductive structure 126 is coupled with the conductive feature 119 of the metallization structure 106, and extends outward from the upper side 121 of the metallization structure 106.

The microelectronic device 100 also includes a repassivation layer 128 (e.g., a printed polymer material) disposed on the side 121 of the wafer 120 proximate a side of the conductive contact structure 122, and a solder ball structure 130 connected to the conductive structure 126. The conductive seed layer 124 is disposed at least partially on the corresponding conductive feature 119. In one example, the conductive seed layer 124 includes titanium (Ti) or titanium tungsten (TiW). The individual contact structures also include a copper structure 126 that extends at least partially outward (e.g., upward in FIG. 1) from the upper side 121 of the wafer or die 120. In one example, the copper structure 126 provides a copper pillar or post for subsequent soldering to a substrate or chip carrier using the solder ball 130. In one example, the lateral dimensions of the conductive seed layer 124 and the copper structure 126 (e.g., along the X-axis direction in FIG. 1) are approximately equal to one another.

In one example, the deposited (e.g., printed) polymer material 128 is disposed on (e.g., extends to) a lateral side of the copper structure 126. In another example, the printed polymer material 128 is spaced from at least one lateral side of the copper structure 126. The printed polymer material 128 in certain examples provides a repassivation layer that protects the copper structure 126 and passivates the copper surface thereof. In addition, the printed polymer material 128 in certain examples mechanically strengthens the base of the copper pillar structure 126 during assembly to a carrier substrate (not shown). In one example, the printed polymer material 128 is a thermally cured material that includes one or more of a polyimide, a polybenzoxazole (PBO), an epoxy, or a bismaleimide. In another example, the printed polymer material 128 is an ultraviolet (UV) curable material that includes one or more of a pre-imidized polyimide, an epoxy, an acrylate, a blend or copolymer of epoxy and acrylic crosslinkers, a blend or copolymer of epoxy and phenolic crosslinkers, or a blend or copolymer of epoxy and vinyl crosslinkers. As used herein, a blend is a mixture of components that may or may not react to each other, and a copolymer is a system derived from two or more monomer species that react together. As detailed further below in connection with FIGS. 2-15, the material 128 can be printed using a variety of additive deposition and curing steps, such as inkjet printing and thermal and/or UV curing, to improve material usage, mitigate copper migration, reduce production costs, and to facilitate extension to higher copper density while reducing the number of masks in production. As shown further below in FIG. 12, the device 100 can also include a conductive redistribution layer and a second printed polymer material.

Figure 15:
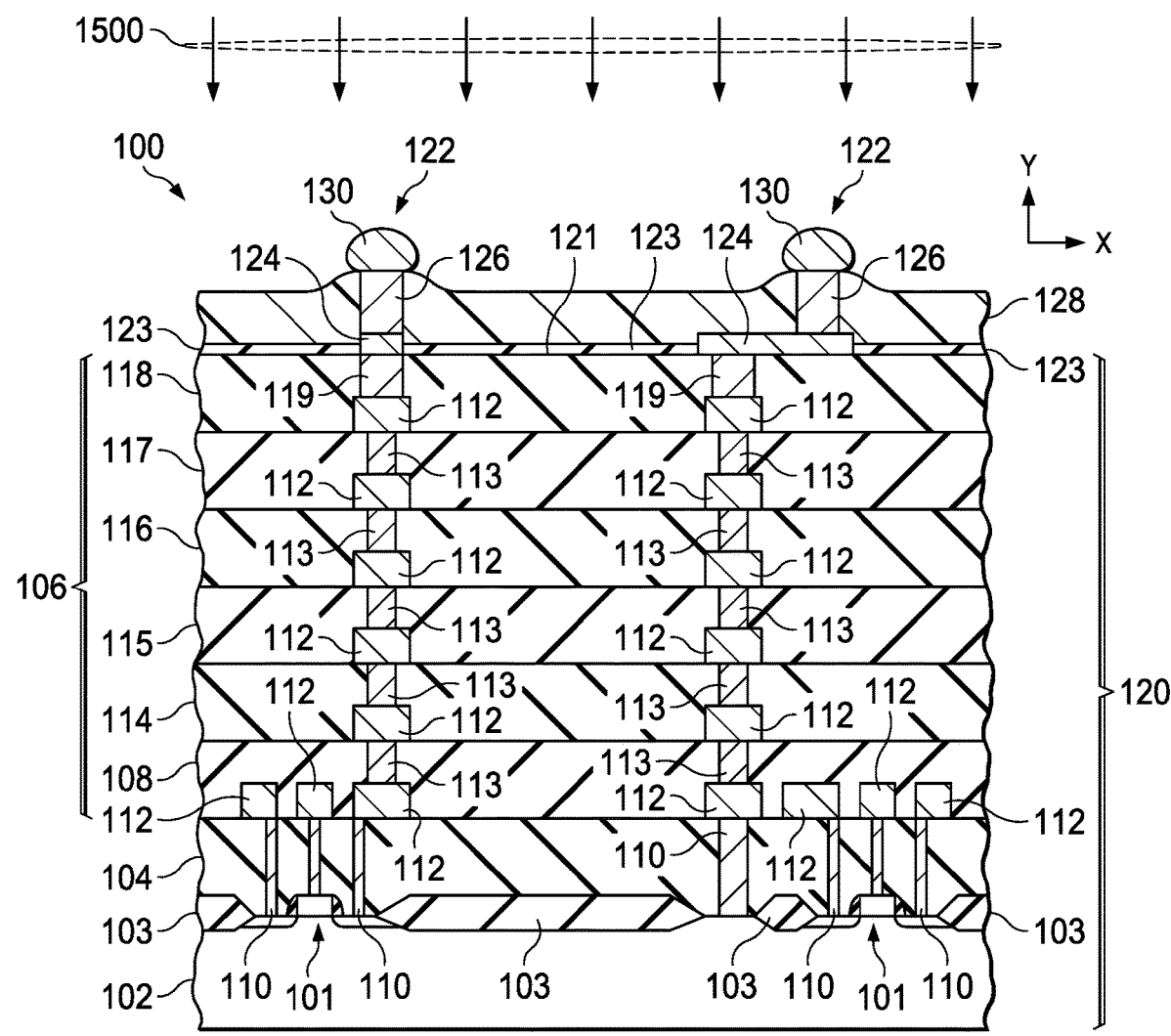
Figure 16:
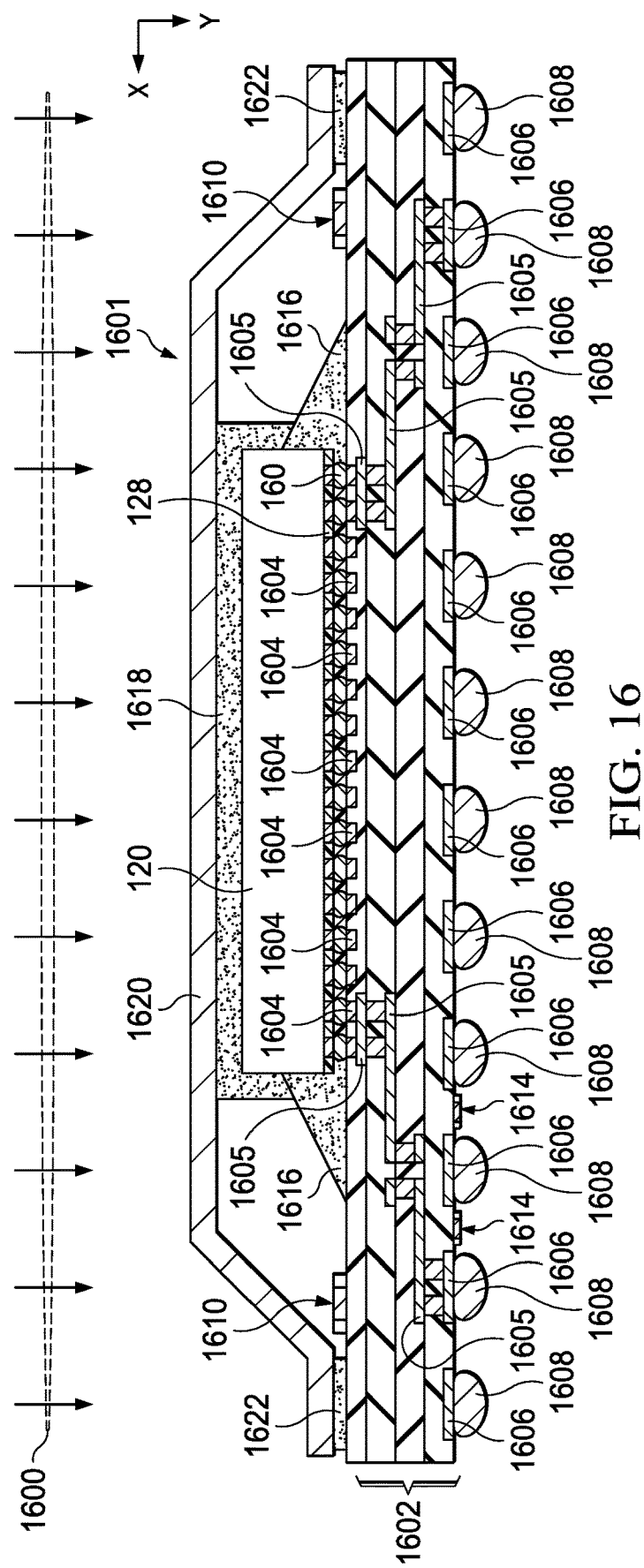
FIG. 16 is a partial sectional side elevation view of a packaged microelectronic device.

Referring also to FIGS. 2A-16, FIGS. 2A and 2B shows a method 200 of fabricating a microelectronic device, such as the device 100 of FIG. 1. The example method 200 advantageously provides ball-first processing in which a solder ball structure (e.g., 130 in FIG. 1) is attached to a side of the conductive structure 126, and thereafter forming a repassivation layer (e.g., layer 128 in FIG. 1) on the side of the wafer 120 proximate the side of the conductive structure 126. In certain examples, the repassivation layer 128 is formed using printing or other additive manufacturing processing. Compared with spin-coded repassivation layer formation techniques, the example method 200 reduces production cost through enhanced repassivation layer material usage. In addition, the example method 200 mitigates or avoids missing solder ball defects due to non-fusion of solder caused by ink bleed out, solder ball cracking and stress concentration delamination as well as bleed out and edge roughness, compared with other processes that provide solder ball attachment after repassivation layer deposition. The example method 200 also includes die singulation and packaging of the device 100 to provide an integrated circuit product. FIGS. 3-15 illustrate processing at various intermediate stages of fabrication to produce the device 100 of FIG. 1 according to the method 200, and FIG. 16 shows an integrated circuit (IC) in the form of a packaged microelectronic device.

Figure 2A:
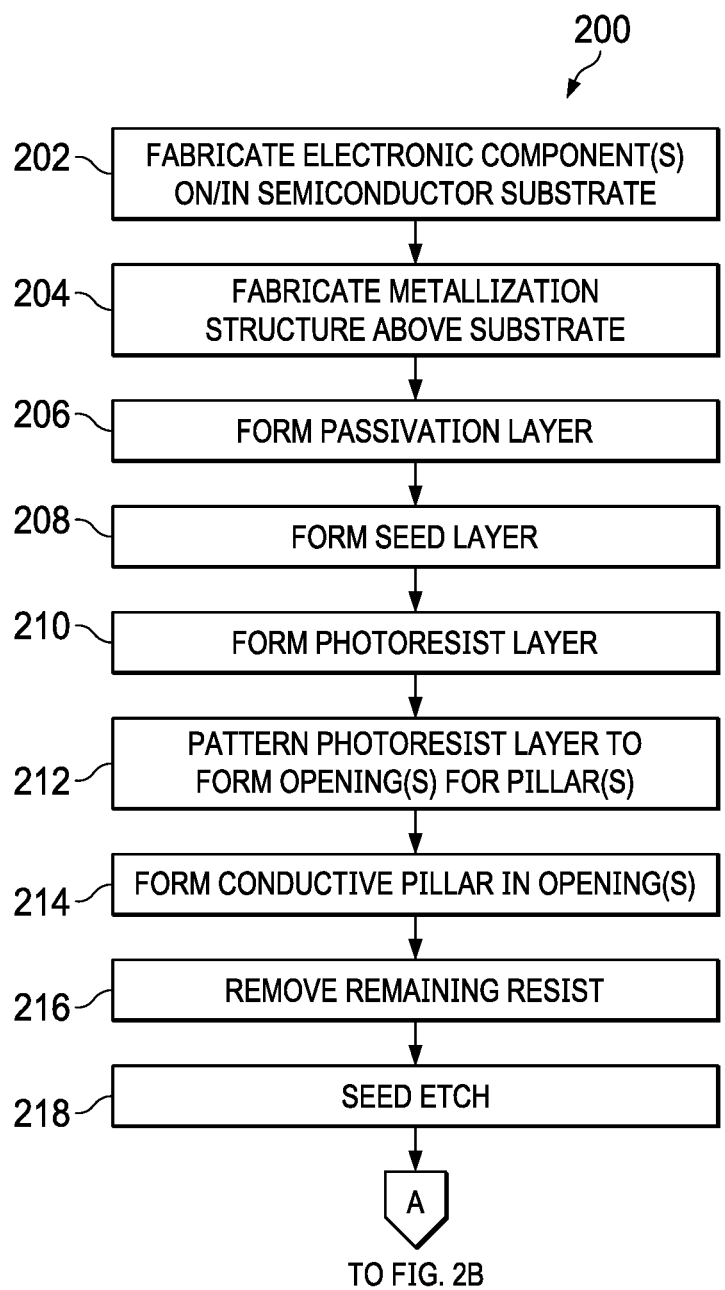
FIGS. 2A and 2B show a flow diagram of a method of fabricating a microelectronic device and a contact structure thereof.
Figure 2B:
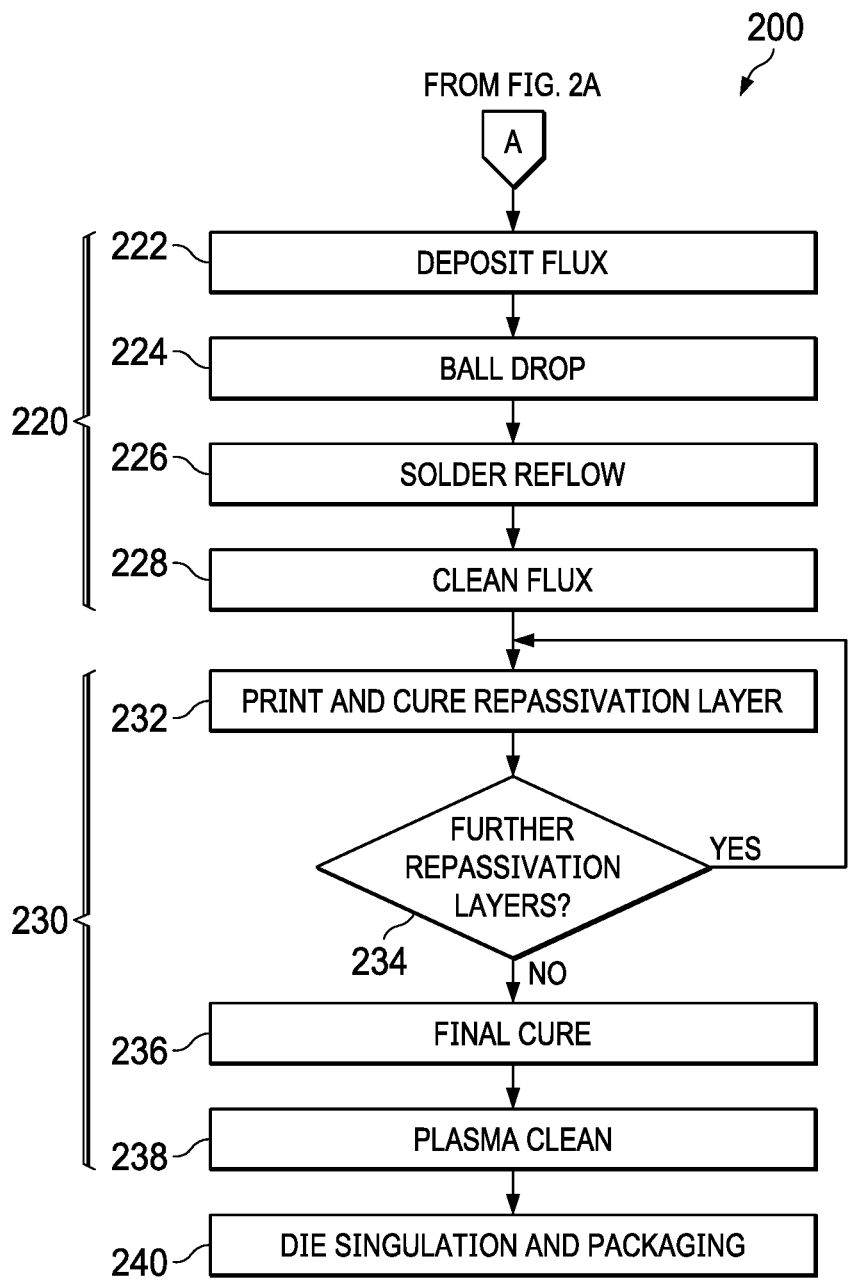
Figure 3:
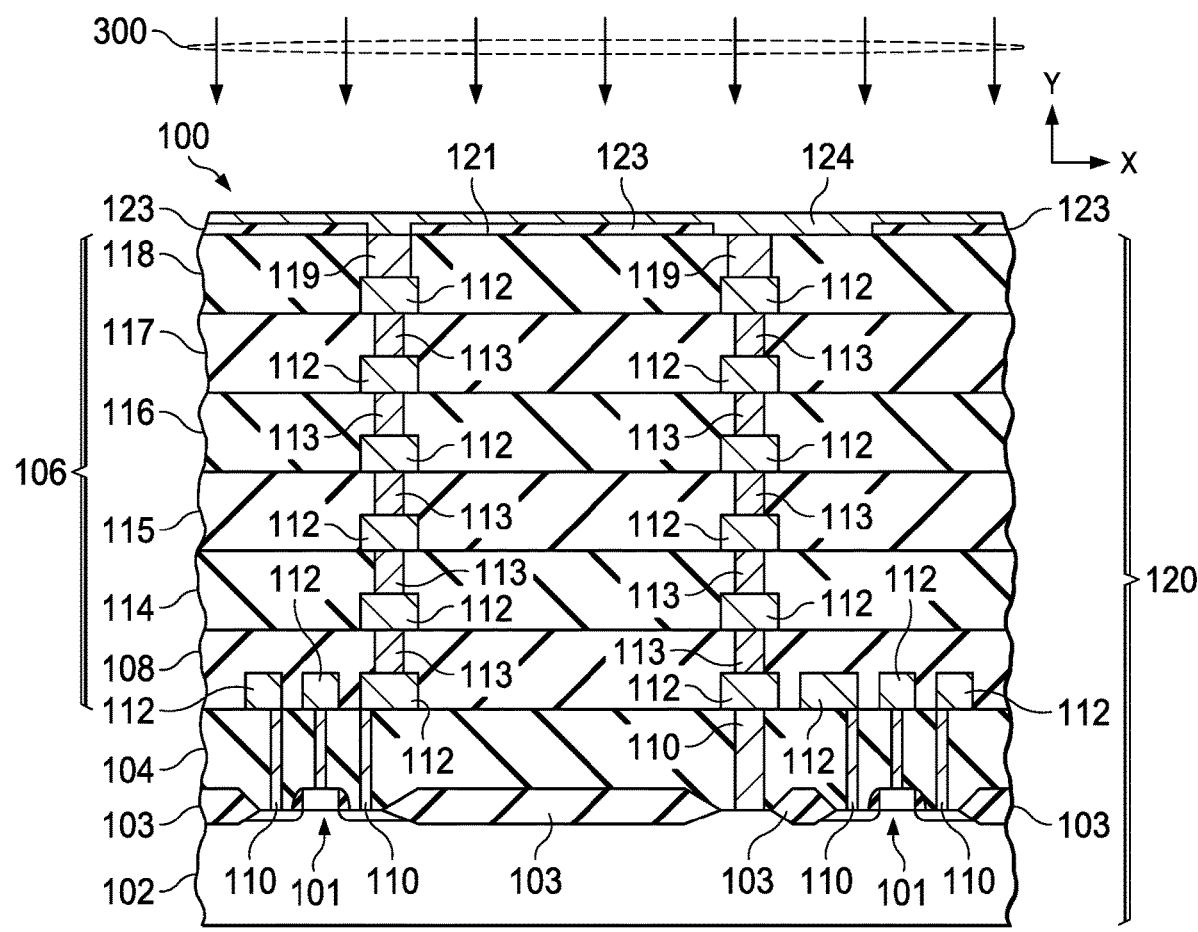
FIGS. 3-15 are partial sectional side elevation views of a microelectronic device undergoing fabrication processing according to the method of FIGS. 2A and 2B.

The method 200 in FIGS. 2A and 2B includes fabricating one or more electronic components on and/or in a substrate at 202 (FIG. 2A). Any suitable semiconductor processing steps can be used at 202 in order to fabricate one or more electronic components on and/or in a semiconductor substrate 102. For example, the processing at 202 can include fabricating one or more transistors 101 on and/or in the semiconductor substrate 102 via processing 300 in FIG. 3. In one example, the fabrication processing at 202 includes fabrication of additional structural features, such as isolation structures 103 shown in FIG. 3. The method 200 in FIG. 2A further includes fabricating a metallization structure above the substrate at 204 (e.g., first dielectric structure layer 104 and an upper metallization structure 106 above the substrate 102 in FIG. 3). FIG. 3 shows processing 300 used to fabricate the electronic components 101 and the metallization structures 104, 106. In certain examples, the metallization structure construction at 204 includes fabrication of one or more additional electronic components (e.g., resistors, inductors, capacitors, transformers, not shown) at least partially in the metallization structure 106.

The method 200 further includes forming a passivation layer at 206 in FIG. 2A. FIG. 3 shows one example, in which the processing 300 includes forming the passivation layer or layers 123 with openings that expose the upper portions of the conductive features 119 of the metallization structure 106 to allow electrical connection of the features 119 to subsequently formed contact structures. The method 200 in FIG. 2A also includes forming a conductive seed layer at least partially on a conductive feature of the wafer 120 at 208. FIG. 3 shows one example, in which the processing 300 includes a sputtering or electroplating deposition process that deposits the conductive seed layer 124 on the upper side 121 of the wafer 120. In one example, a sputter deposition process forms a titanium or titanium tungsten material conductive seed layer 124 on the wafer side 121, which extends at least partially on the conductive features 119 of the wafer 120 as shown in FIG. 3. The processing at 202-208 in one example provides a wafer 120 as shown in FIG. 3. At this point in the fabrication process 200, the deposited seed layer material 124 also extends over the previously deposited passivation layer or layers 123 as shown in FIG. 3.

Figure 4:
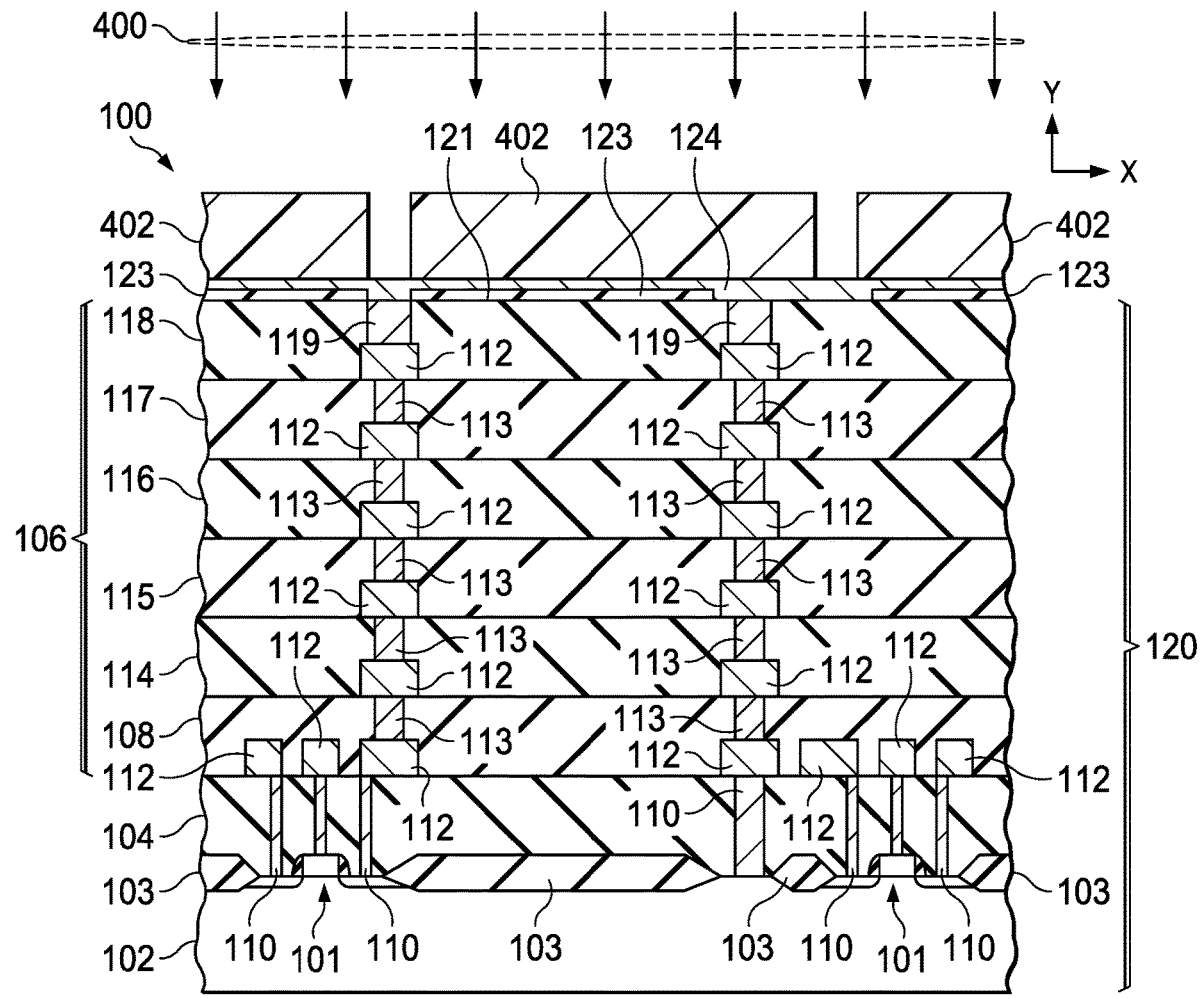

Continuing at 210-218, the example method 200 in FIG. 2A includes forming a conductive structure 126 (e.g., a copper post or pillar) above the deposited seed layer 124. One example includes performing a damascene process at 214 that deposits conductive material into an opening of a patterned photoresist to form the conductive structure 126 above the conductive feature 119. This example includes forming a photoresist layer at 210, and patterning the photoresist layer at 212 to form openings for pillars. FIG. 4 shows an example deposition process 400 that deposits and patterns a photoresist material layer 402. The photoresist layer 402 in one example is patterned at 212 using a photolithography process that selectively removes portions of the photoresist material 402 to expose portions above the conductive features 119 of the wafer 120. The lateral (e.g., X-axis) width of the openings in the photoresist layer 402 in one example is generally coextensive with the lateral width of the conductive features 119 of the wafer 120, although not a requirement of all possible implementations.

Figure 5:
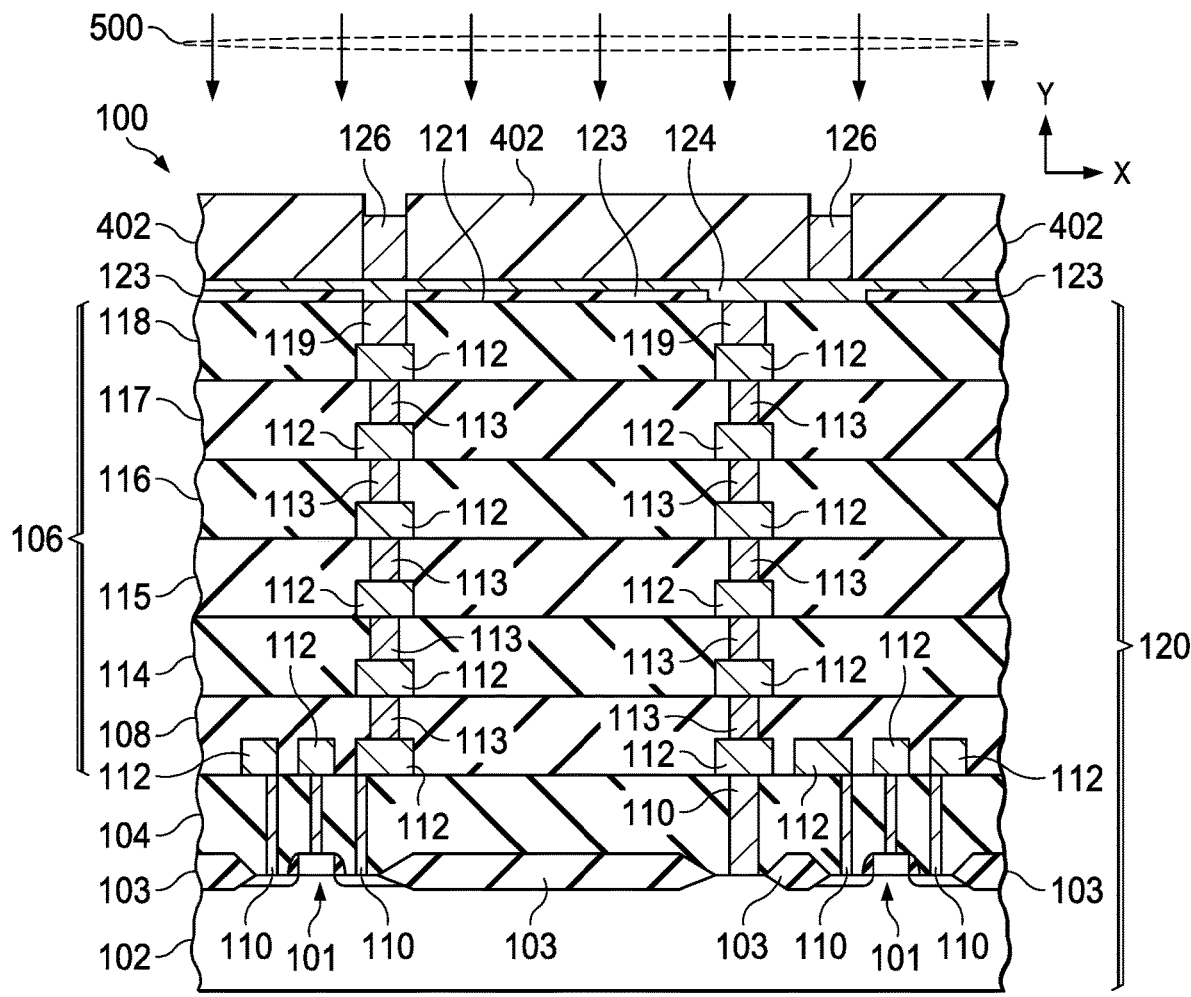

The method 200 further includes forming a conductive material (e.g., copper) in the patterned openings at 214. The conductive structure formation in one example includes depositing copper material at 214 on the exposed portion of the seed layer material 124 (if included) above the conductive feature 119. Where no seed layer 124 is used, the conductive material is deposited on the exposed portions of the conductive feature 119. FIG. 5 shows one example, including performing an electroplating deposition process 500 that forms the copper conductive structures 126 in the openings of the patterned photoresist 402. The process 500 forms the copper structures 126 on the exposed portions of the conductive feature 119 of the wafer 120 or any intervening seed layer material 124. The method 200 continues at 216 in FIG. 2A with removing the remaining resist layer.

Figure 6:
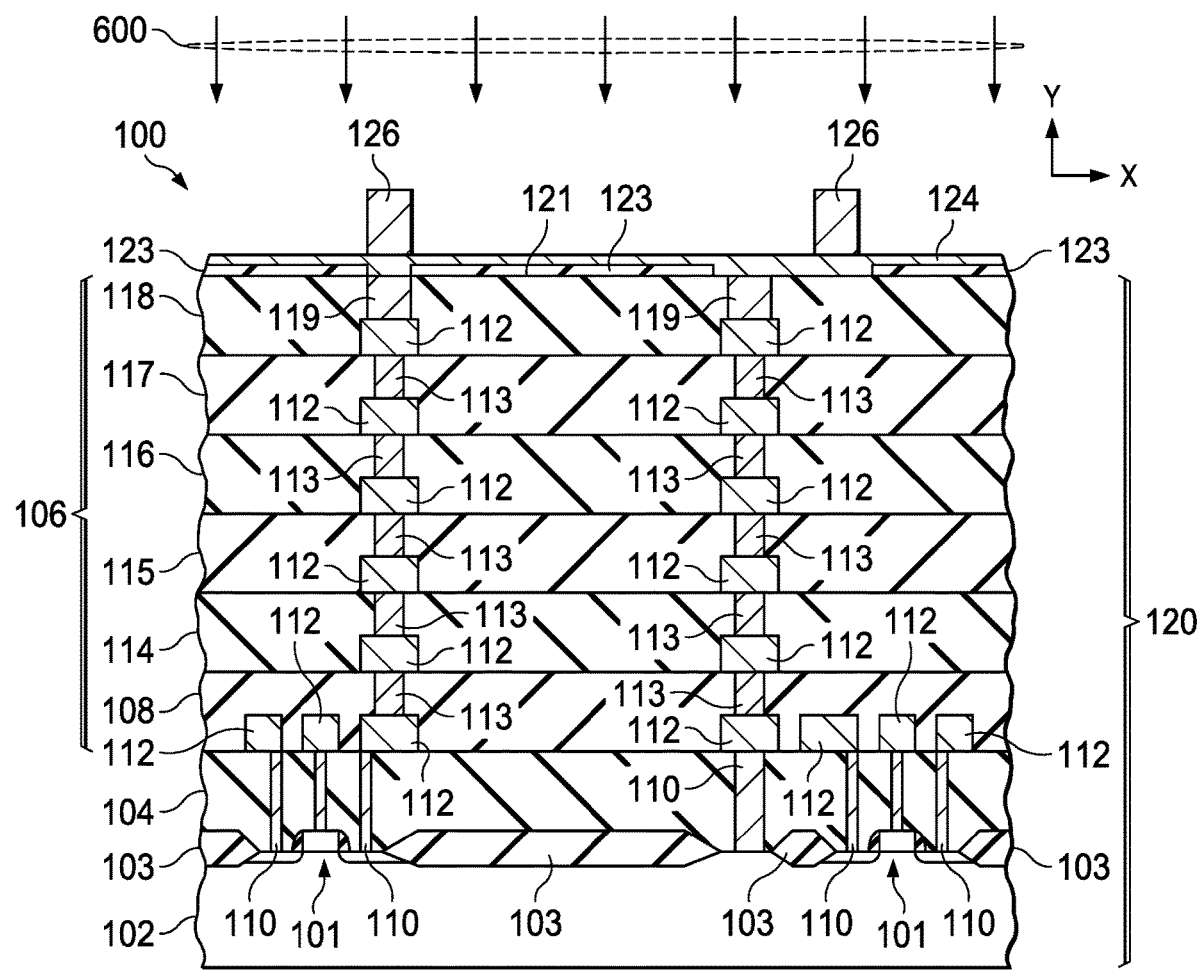

FIG. 6 shows a photoresist removal process 600 (e.g., selective etch) that removes the photoresist material 402 from the wafer 120.

Figure 7:
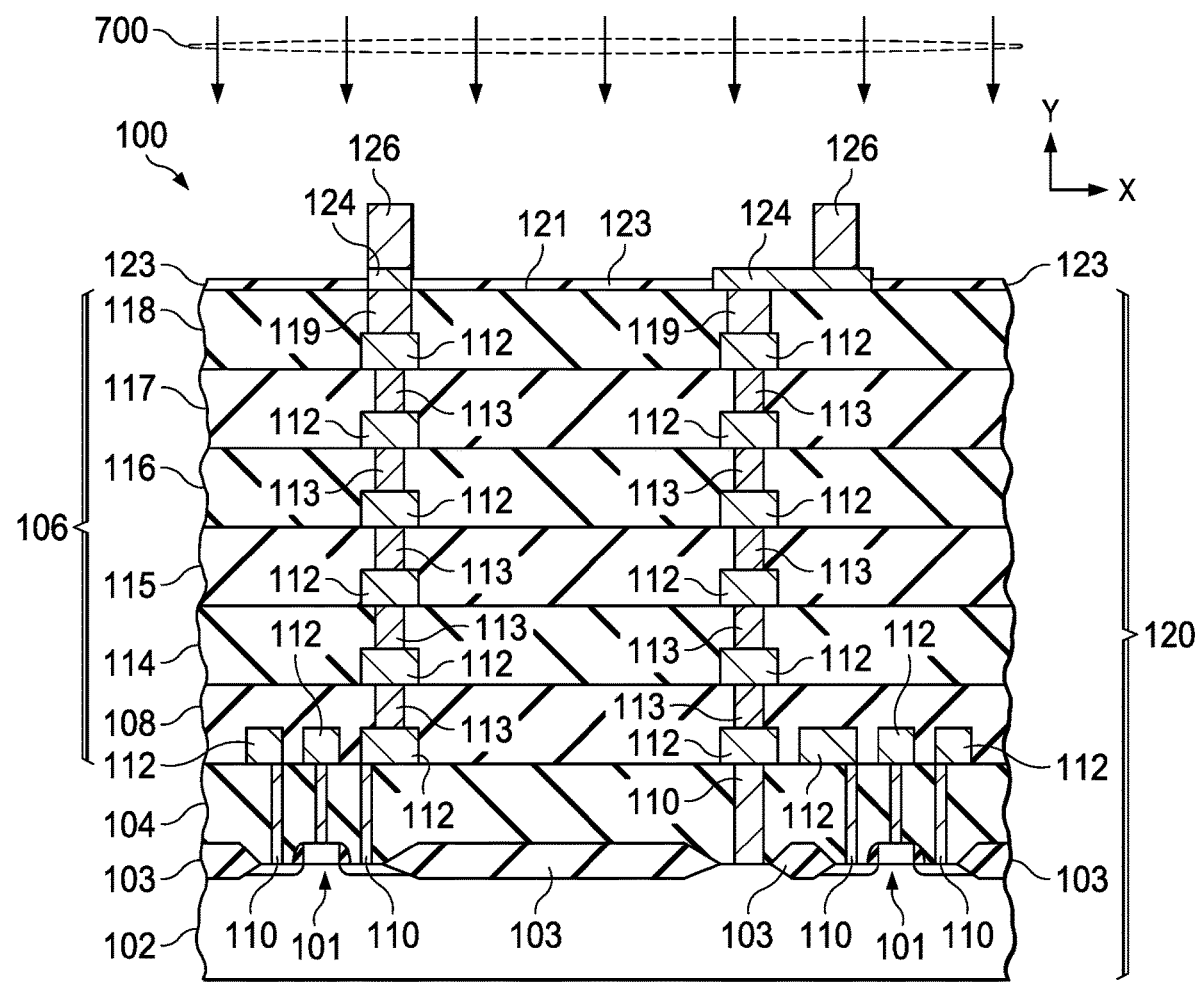

Although the example method 200 is illustrated and described above using a damascene type process to form the copper structures 126 using a patterned photoresist 402, other processing steps can be used to form a conductive copper structure 126 on the seed layer 124 over the conductive feature 119 of the wafer 120, or directly on the conductive feature 119 without using a seed layer. Moreover, although the illustrated example wafer 120 includes multiple conductive features 119 and corresponding contact structures 122, other implementations are possible in which only a single contact structure 122 is formed, and further examples are possible in which more than two contact structures 122 are formed. The method 200 continues in FIG. 2A with a seed etch at 218 that removes exposed portions of any included seed layer 124. FIG. 7 shows an example in which an etch process 700 is performed that etches the exposed seed layer 124 to expose a portion of the passivation layer or layers 123.

Figure 8:
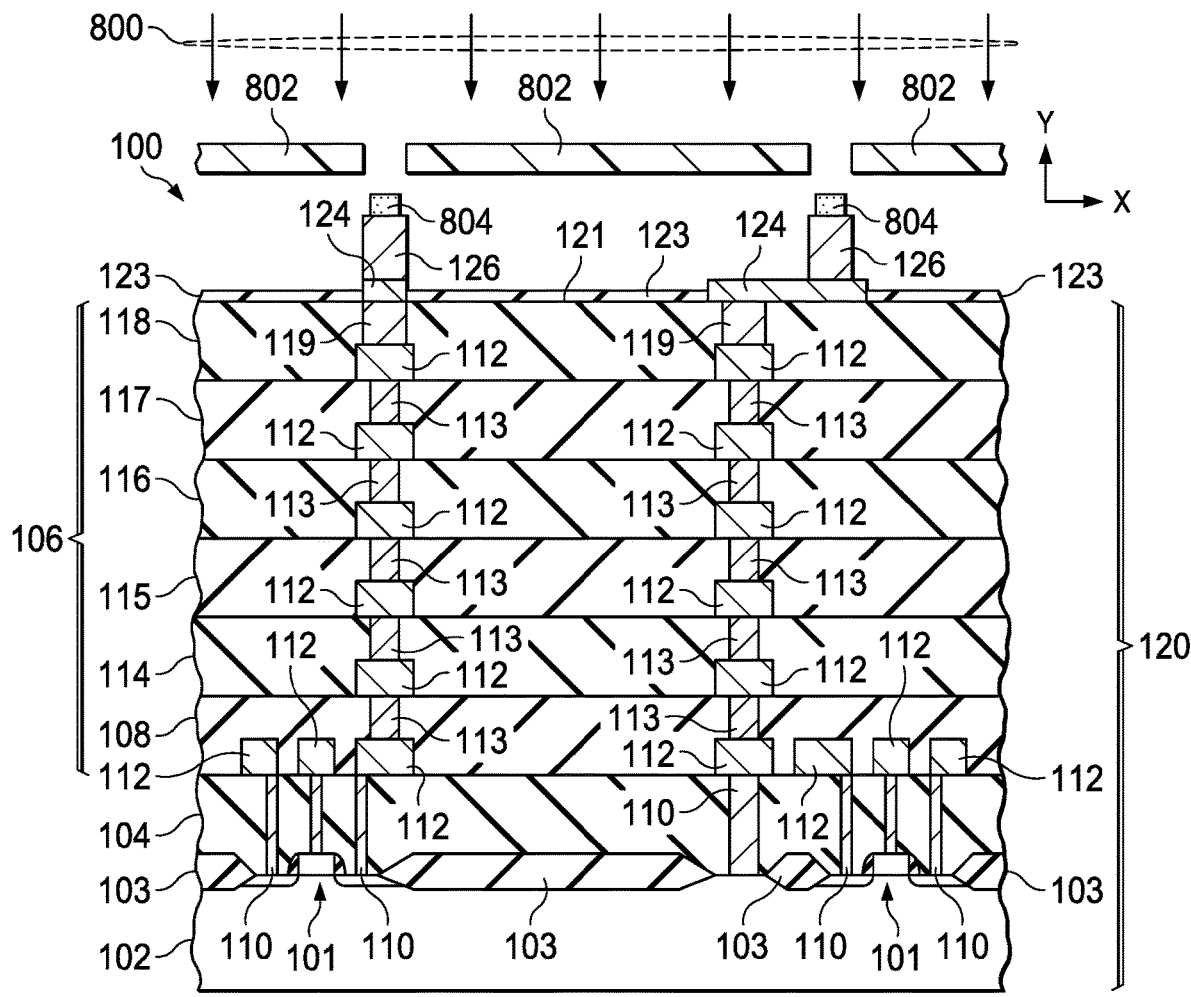
Figure 9:
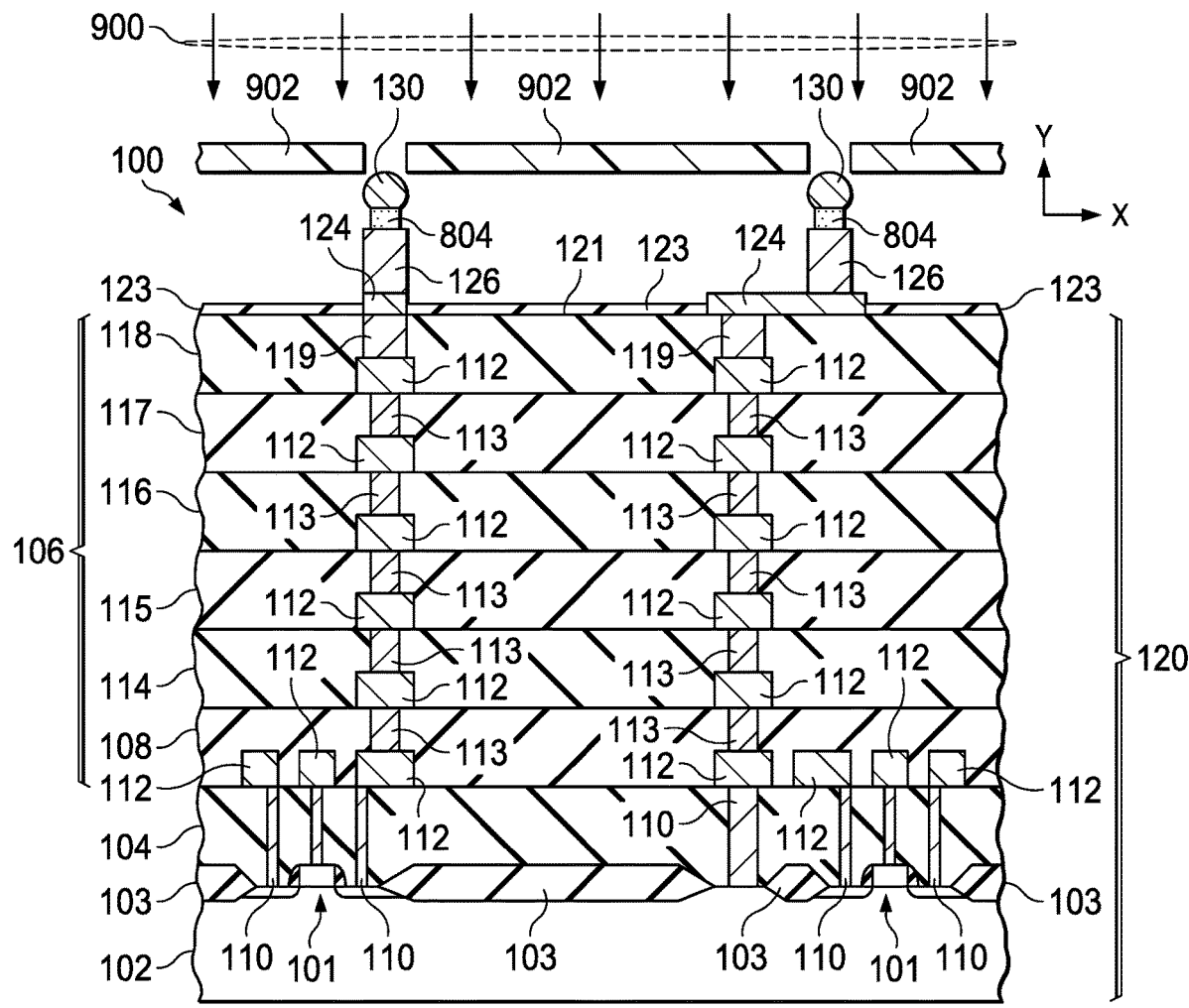
Figure 10:
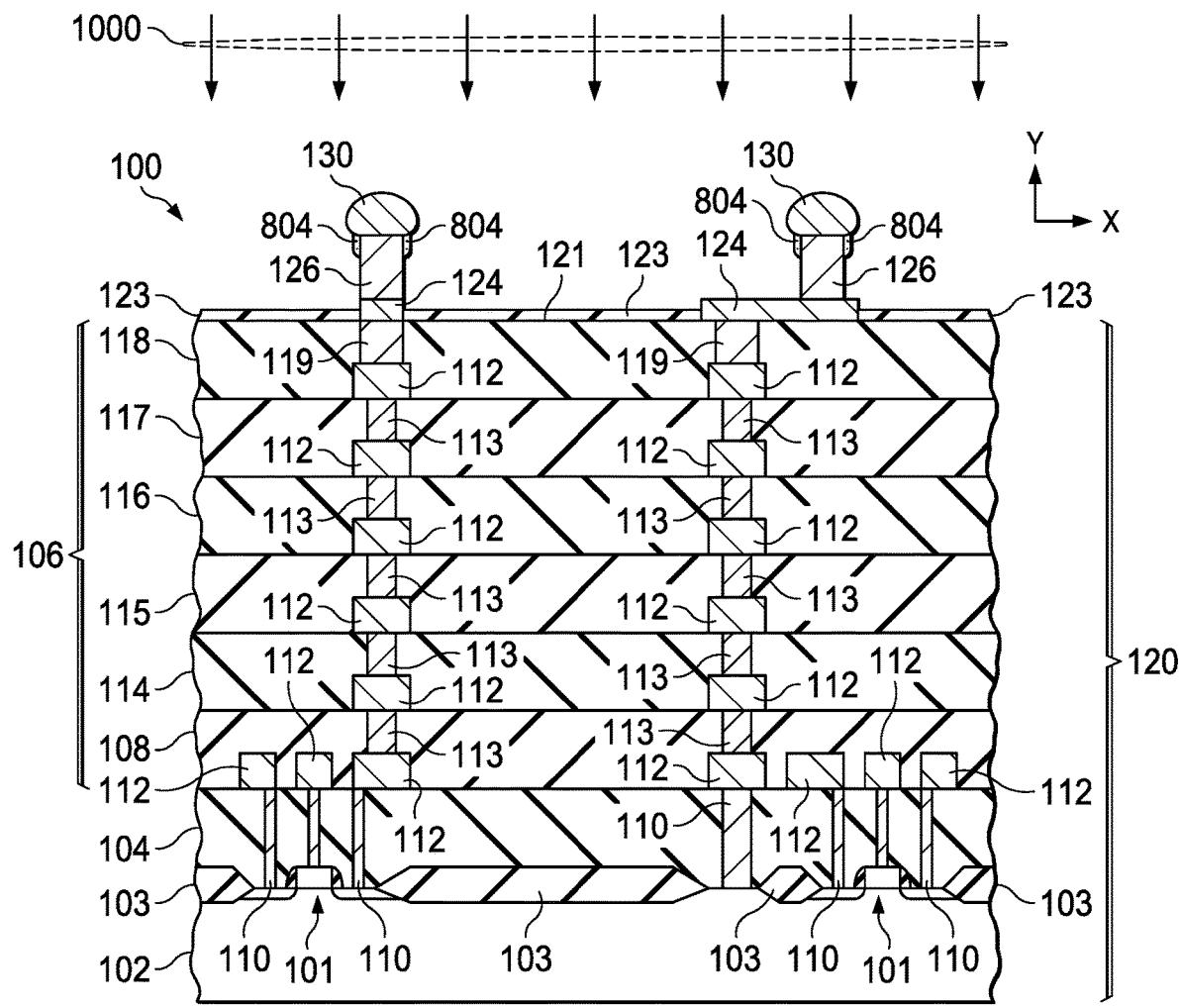
Figure 11:
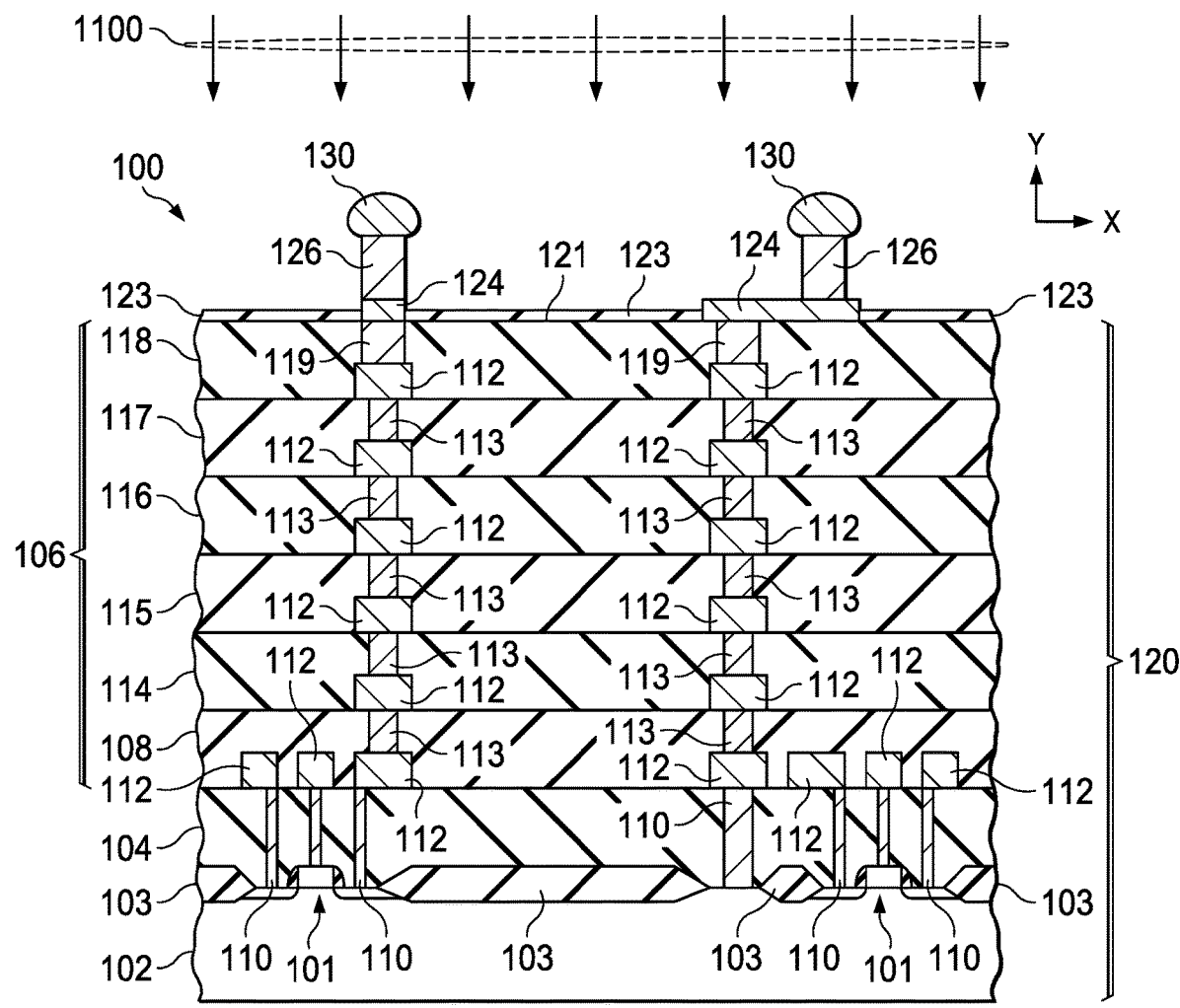

Continuing in FIG. 2B, the example method 200 provides ball-first processing, including attaching a solder ball structure 130 to a side of the conductive structure 126 at 220 and, after attaching the solder ball structure to the side the conductive structure 126, forming a repassivation layer 128 at 230 on a side of the wafer 120 proximate the side of the conductive structure 126. In one example, the solder ball attachment processing at 220 includes depositing flux on at least a portion of a side (e.g., the top) of the conductive structure 126. FIG. 8 shows an example flux deposition process 800 that deposits flux material 804 on at least a portion of the tops of the conductive structures 126 using a mask 802 supported above the upper surface of the wafer 120. The flux mask 802 is then removed automatically by processing equipment used to deposit the flux material 804. The solder ball attachment continues at 224 in FIG. 2B, including ball drop or ball placement. FIG. 9 shows an example ball drop process 900 that drops solder balls structures 130 to portions of the flux 804 in openings of a ball drop mask 902 supported above the upper surface of the wafer 120. The ball drop mask 902 is then removed automatically by processing equipment used to place the solder balls 130. At 226 in FIG. 2B, the solder ball attachment processing 220 continues with thermal processing at 226 to reflow portions of the solder structure 130. FIG. 10 shows an example thermal process 1000 that heats or otherwise reflows the solder ball structures 130. The reflow processing at 226 in one example consumes all or at least a portion of the previously deposited flux material 804. In the example of FIG. 10, slight amounts of residual flux 804 may remain after the thermal processing 1000. The example method 200 in FIG. 2A also includes an optional flux cleaning operation at 228. FIG. 11 shows an example cleaning process 1100 that removes all or at least a portion of residual flux material. The ball attach processing at 220 attaches solder balls 130 to the top surfaces of the exposed portions of the conductive copper pillar structures 126 as shown in FIG. 11.

Figure 12:
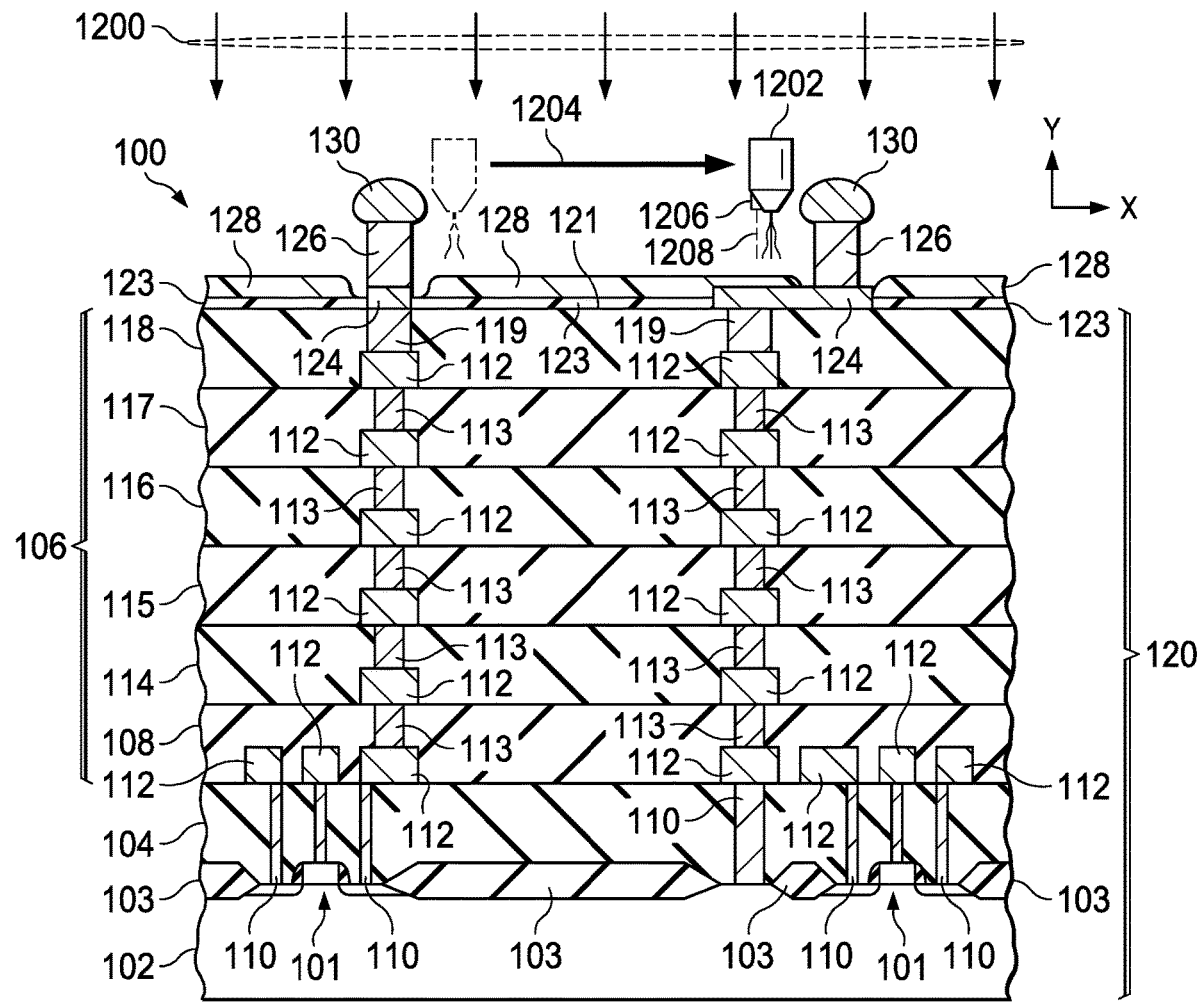
Figure 13:
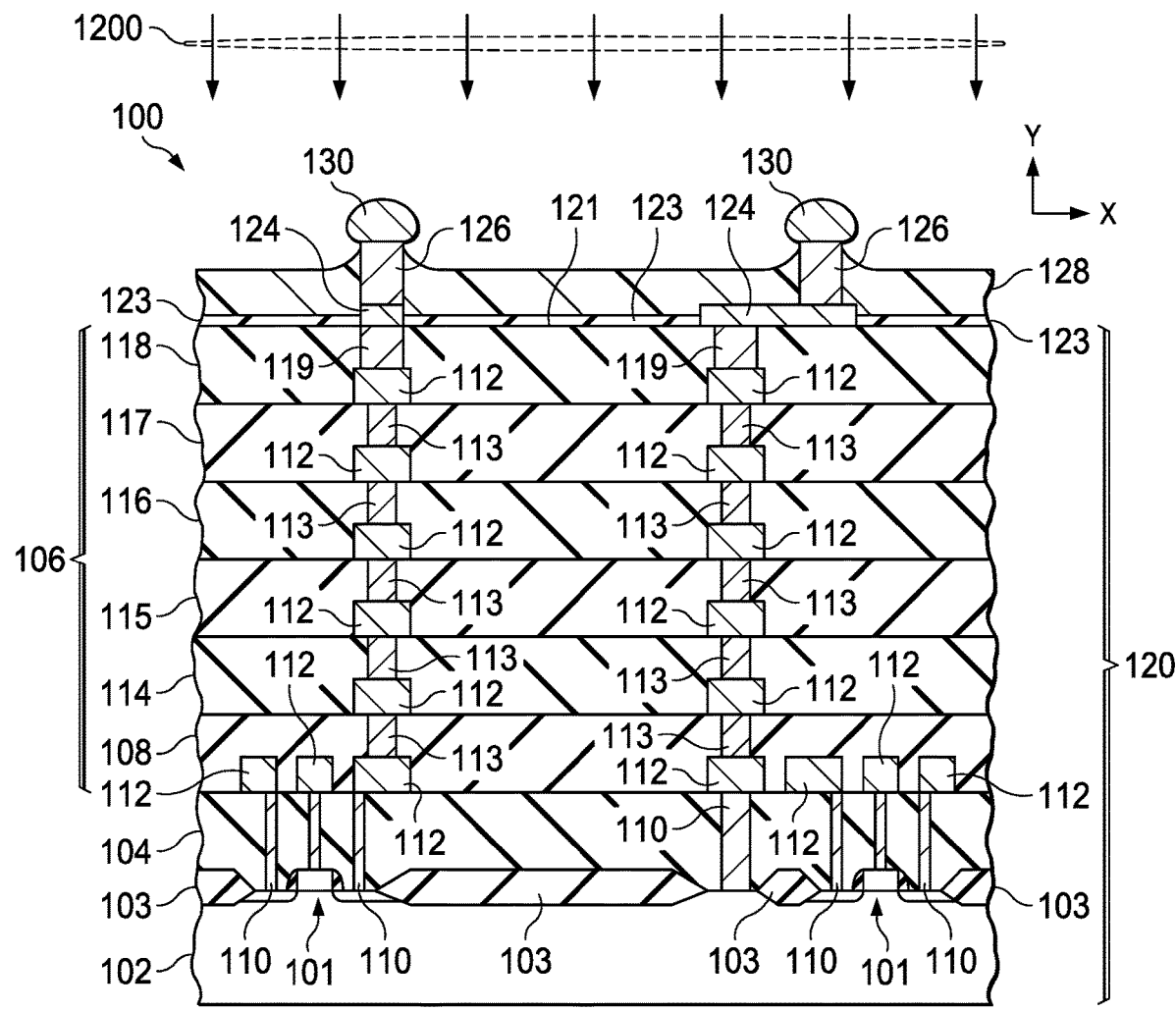

The repassivation layer 128 is formed at 230 in FIG. 2B. Any suitable deposition process can be performed at 230. In one example, the processing at 230 includes performing a printing process at 232 that forms a printed polymer material 128 on a side of the wafer 120 proximate a side of the conductive structure 126, as shown in FIGS. 12-15. FIGS. 12 and 13 show an example in which an inkjet printing process 1200 is performed using a print head 1202. The process 1200 selectively prints or deposits the printed polymer material 128 on predetermined exposed portions of the passivation layer 123. As shown in FIG. 12, the printing processing 1200 in one example prints the polymer repassivation material 128 proximate to (e.g., slightly spaced laterally from or engaging) the lateral sides of the copper pillar structures 126, although a spaced relationship is not a requirement of all possible implementations.

Any suitable repassivation material and printing process can be used at 232. In one example, a printable material 128 is used which has a viscosity of 10-30 cP, a surface tension of 20-40 mN/m, and a solids particle size of less than 200 nm, although not strict requirement of all possible implementations In one example, thermal-based inks are used, such as polyimide, epoxy, bismaleimide, where the thermal-based inks are solvent-diluted systems with a solids contents range of 20-35 wt % for thermal in situ and/or post-curing. In another example, UV-based inks are printed at 232, such as pre-imidized polyimide, epoxy, acrylate, blend or copolymer of epoxy and acrylic crosslinkers, blend or copolymer of epoxy and phenolic crosslinkers, blend or copolymer of epoxy and vinyl crosslinkers, where the UV-based inks include UV initiators to start the polymerization. In some examples, the UV-based inks are solventless systems. In other examples, UV-based inks can be used which are solvent-diluted systems with solids contents between 20-35 wt %. In certain examples, post-cured UV-based inks can be used. In other examples, UV-based inks can be printed using a print head with a UV light source (e.g., 1206 in FIG. 12) to at least partially thermally cure (e.g., "pin") the printed material 128 to the printed surface during printing, alone or in combination with subsequent final curing (e.g., at 236 in FIGS. 2A and 2B).

The printing processing at 232 advantageously economizes consumption of the printed repassivation material 128, thereby reducing production costs and enhancing material usage in the fabrication process 200, particularly compared with conventional spin-coat deposition approaches. FIG. 12 illustrates one example using an inkjet printer apparatus programmed according to a design layout of the wafer 120, where the print head 1202 moves along a programmed path 1204 to selectively print the material 128 in desired locations on the top side of the wafer 120. In one example, an initial curing function is implemented concurrently with the printing at 232 to at least partially cure the repassivation material 128 during printing. One example implementation includes heating the wafer 120 while performing the printing process at 232 to at least partially cure the printed polymer material 128. In another example, the print head 1202 is equipped with an ultraviolet light source 1206 that emits ultraviolet light 1208 as shown in FIG. 12 during the printing process at 232. This example includes exposing the polymer material 128 to ultraviolet light while performing the printing process to at least partially cure the polymer material 128.

A single printed repassivation layer 128 can be formed in certain examples. In other examples, the printing processing includes performing multiple printing passes to deposit multiple layers of the polymer material 128 proximate the side of the conductive structure 126. In one example, the process 200 further includes determining at 234 whether further passivation layers are desired. Multiple repassivation material layers 128 can be printed, for example, in order to control the final thickness of the repassivation material layer 128 for a given design. If a further passivation material layer is desired (YES at 234), another repassivation layer is printed and optionally partially cured at 232. FIGS. 12 and 13 show one example implementation, including printing a first layer of the polymer repassivation material 128 in FIG. 12, followed by printing one or more additional layers using the process 1200 in order to form a multilayer repassivation material structure 128 as shown in FIG. 13.

Figure 14:
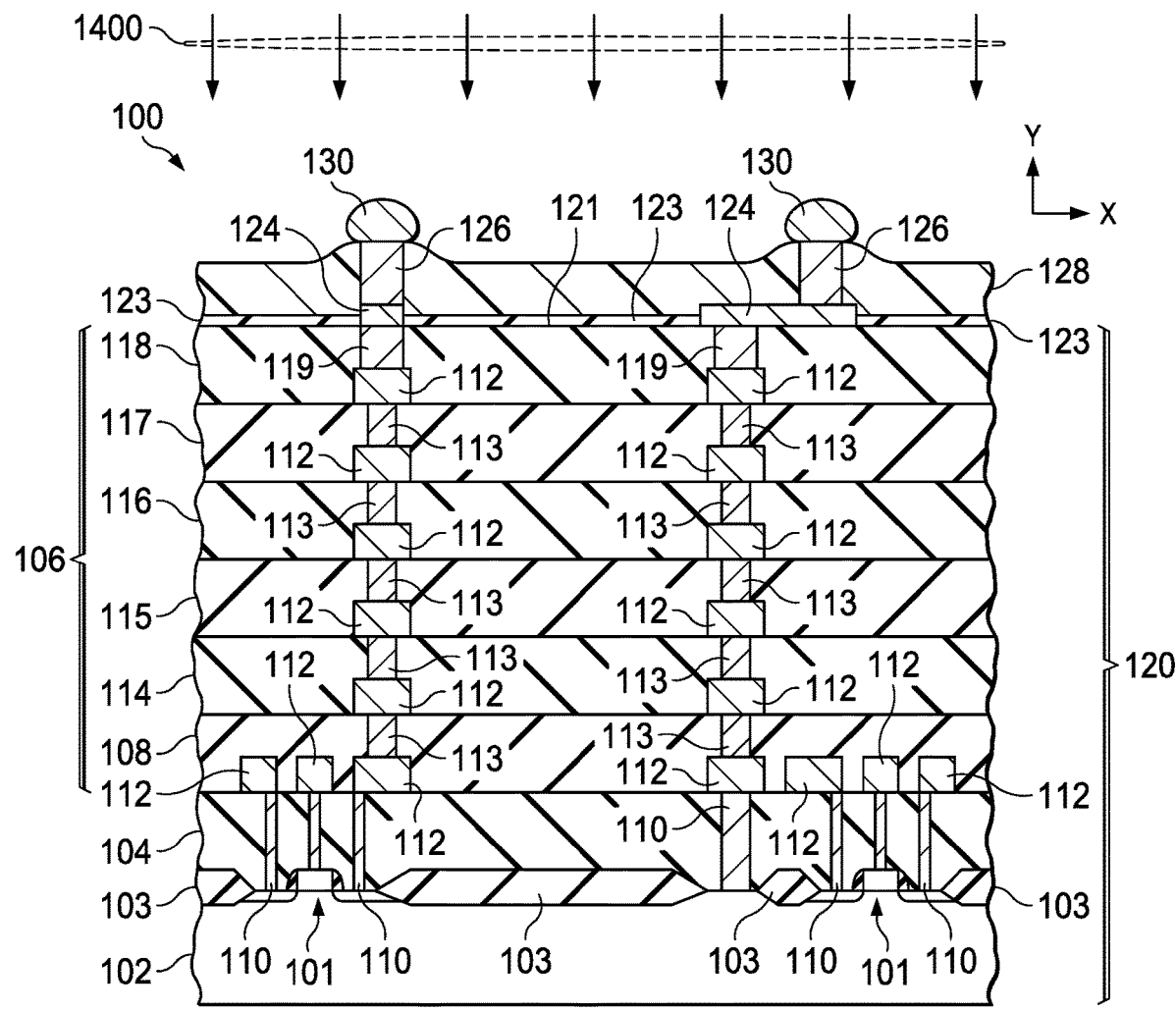

If no additional repassivation layers are desired (NO at 234), the example method 200 continues at 236 in FIG. 2B, with a final curing process that thermally cures the polymer material 128, after performing the printing process 1200. FIG. 14 shows the wafer 120 undergoing a final curing process 1400 that cures the printed polymer material 128. In one example, the final cure process 1400 is a thermal process, for example, that heats the wafer 120 for a suitable duration at an appropriate temperature to cure the polymer material 128. As shown in FIG. 14, the final cure processing at 236 in one example adheres at least some of the printed polymer material 128 to the lateral sides of the conductive copper pillar structures 126, for example, through wicking action. In another example, the final cure processing at 236 includes exposing the wafer 120 to ultraviolet light, for example, to cure a UV curable printed polymer material 128. The example method 200 continues with a plasma cleaning step at 238. FIG. 15 shows an example plasma cleaning process 1500 that moves any residual uncured polymer material 128.

The method 200 also includes die singulation (e.g., separation of the wafer 120 into two or more dies) and packaging at 240 in FIG. 2B to provide a completed microelectronic device, whether including a single electronic component 101, or an integrated circuit that includes multiple electronic components 101, that includes a package structure that encloses the die 120 and provides electrical connection to the conductive contact structure 122. The device can be used in a variety of different product configurations, such as fine pitch flip chip packages (e.g., FCBGA), flip chip on lead packages (e.g., FCOL), and wafer level chip scale packages (WLCSP), etc. FIG. 16 shows an example packaged flip chip ball grid array (FCBGA) integrated circuit (IC) device 1601 resulting from packaging processing 1600 using a singulated die from the wafer 120 of FIG. 15. The flip chip implementation uses small print head tips to print the passivation material (e.g., print head 1202 in FIG. 12 above). Lower resolution printing equipment can be used to print the passivation material 128 for WLCSP devices. The example IC 1601 in FIG. 16 includes the die 120 soldered to a substrate or carrier 1602 using the solder balls 130. In one example, at 240 in FIG. 2B, the die 120 is soldered to the carrier substrate 1602 using a surface mount technology (SMT) process that solders the solder balls 130 to conductive pads 1604 on an upper side of the carrier substrate 1602. The reflow of the solder balls 130 creates a solder joint between the conductive copper pillar structures 126 of the die 120 and the conductive pads 1604 of the PCB 1602. The IC 1601 also includes conductive pads 1606 located on the bottom side of the carrier substrate 1602, along with corresponding solder balls 1608 to allow the IC 1601 to be soldered to an end-user printed circuit board (not shown).

In this example, the carrier substrate 1602 also includes capacitors or other electronic components 1610 soldered to the upper or top side of the carrier substrate 1602, as well as additional exposed (e.g., lower side) electronic components (e.g., capacitors) 1614 on the bottom side of the carrier substrate 1602. The finished IC 1601 in FIG. 16 also includes an underfill adhesive material 1616 (e.g., epoxy) that seals the soldered connection between the die 120 and the carrier substrate 1602. In one example, the carrier substrate 1602 is a multilayer printed circuit board structure including a printed circuit board material, such as polyimide, glass-reinforced epoxy laminate material (e.g., flame retardant FR-4 material compliant with the UL94V-0 standard) or substrate build-up technology with Ajinomoto build-up film (ABF) dielectric layers laminated between copper layers above and below a rigid core material. The substrate 1602 can be a single layer structure or a multi-layer substrate in other examples. The substrate 1602 in one example includes plated through holes and/or micro-vias, some or all of which provide electrical interconnection between dielectric layers of a multi-layer structure. The substrate 1602 also includes traces or conductive routing features on a top side, a bottom side, and/or within or between internal layers selectively connected by conductive vias structures. The illustrated example includes conductive connections 1605 (e.g., aluminum and/or copper). The individual connections 1605 electrically connect one or more of the conductive pads 1604 on the upper side of the substrate 1602 to one or more associated conductive pads 1606 on the bottom side of the substrate 1602. The connections 1605 include one or more of the trace layers and vias structures. The example IC 1601 also includes a lid or heat spreader structure 1620 (e.g., nickel plated copper, AlSiC, Al, etc.) mounted to a top surface of the die 120 via a thermal interface material (e.g., silicone gel, etc.) 1618, along with a conductive or nonconductive lid seal adhesive 1622 that holds outer portions of the lid 1620 to the carrier substrate 1602.

In another example, a wafer level chip scale package (WLCSP) IC is created at 240 in FIG. 2 that includes the die 120 soldered to a host printed circuit board (PCB) using SMT processing that solders the solder balls 130 to conductive pads on an upper side of the PCB. In this example, a surface mount technology process is performed at 240 in FIG. 2 to reflow the solder balls 130 to create a solder joint between the conductive copper pillar structures 126 of the die 120 and the conductive pads of the PCB.

Figure 17:
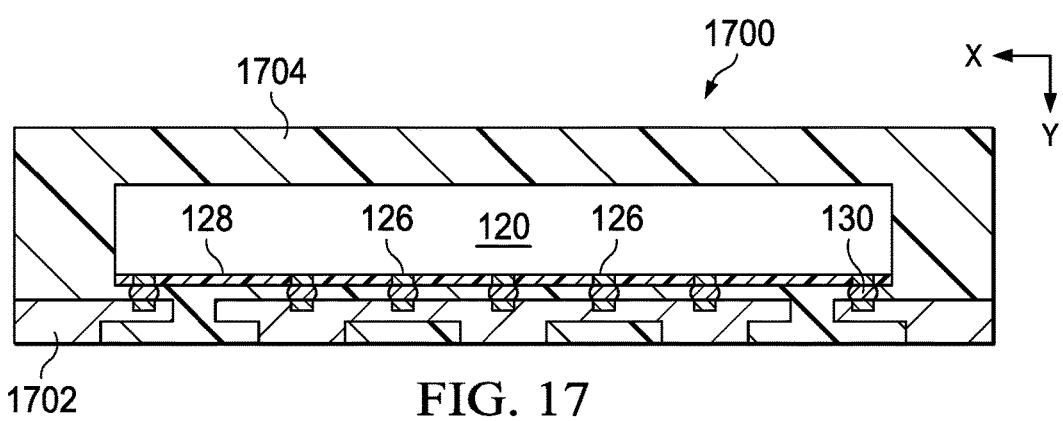
FIG. 17 is a partial sectional side elevation view of another packaged microelectronic device.

FIG. 17 shows an example packaged flip chip on lead (FCOL) IC 1700. The IC 1700 is a molded package lead frame assembly that includes the die 120 soldered to leads of a conductive metal lead frame structure 1702. The die 120 and the leadframe are encapsulated in a ceramic structure or a molded material 1704, such as plastic. The lead frame 1702 and the material 1704 encloses the die 120. Portions of the lead frame 1702 are not covered by the material 1704 to allow electrical connection of user circuit board pads to the conductive contact structure 122 when the IC 1700 is soldered to a host printed circuit board (not shown). The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. A method, comprising:
    forming a conductive structure at least partially above a conductive feature of a wafer;
    attaching a solder ball structure to a side of the conductive structure; and
    after attaching the solder ball structure to the side of the conductive structure, forming a repassivation layer on a side of the wafer proximate the side of the conductive structure, wherein forming the repassivation layer on the side of the wafer includes:
        performing a printing process that forms the repassivation layer on the side of the wafer proximate the side of the conductive structure; and
        curing the repassivation layer including heating the wafer while performing the printing process to at least partially cure the repassivation layer.

2. The method of claim 1, wherein curing the repassivation layer further includes:
    after performing the printing process, performing a final curing process that thermally cures the repassivation layer.

3. A method, comprising:
    forming a conductive structure at least partially above a conductive feature of a wafer;
    attaching a solder ball structure to a side of the conductive structure; and
    after attaching the solder ball structure to the side of the conductive structure, forming a repassivation layer on a side of the wafer proximate the side of the conductive structure, wherein forming the repassivation layer on the side of the wafer includes:
        performing a printing process that forms the repassivation layer on the side of the wafer proximate the side of the conductive structure; and
        curing the repassivation layer including exposing the repassivation layer to ultraviolet light while performing the printing process to at least partially cure the repassivation layer.

4. The method of claim 3, wherein curing the repassivation layer further includes:
    after performing the printing process, performing a final curing process that UV cures the repassivation layer.

* * * * *